United States Patent
Kühn

(10) Patent No.: US 7,463,020 B2
(45) Date of Patent: Dec. 9, 2008

(54) INDUCTIVE PROXIMITY SWITCH BASED ON A TRANSFORMER COUPLING FACTOR PRINCIPLE

(75) Inventor: Thomas Kühn, Mannheim (DE)

(73) Assignee: Pepperl & Fuchs GmbH, Mannheim (DE)

( * ) Notice: Subject to any disclaimer, the term of this patent is extended or adjusted under 35 U.S.C. 154(b) by 0 days.

(21) Appl. No.: 11/884,040

(22) PCT Filed: Feb. 8, 2006

(86) PCT No.: PCT/EP2006/001097

§ 371 (c)(1),
(2), (4) Date: Aug. 31, 2007

(87) PCT Pub. No.: WO2006/084675

PCT Pub. Date: Aug. 17, 2006

(65) Prior Publication Data
US 2008/0204118 A1    Aug. 28, 2008

(30) Foreign Application Priority Data
Feb. 8, 2005 (DE) ........................ 10 2005 005 831
Mar. 17, 2005 (DE) ........................ 10 2005 012 892

(51) Int. Cl.
*G01B 7/14* (2006.01)
*G01B 7/30* (2006.01)
*G01B 7/00* (2006.01)
*G01R 33/00* (2006.01)

(52) U.S. Cl. .................. 324/207.11; 324/207.12; 324/207.18

(58) Field of Classification Search ........... 324/207.15, 324/207.11, 207.18, 207.26, 225, 222, 236, 324/207.12; 335/229, 172, 29
See application file for complete search history.

(56) References Cited

U.S. PATENT DOCUMENTS
5,721,489 A    2/1998   Weaver et al.
(Continued)

FOREIGN PATENT DOCUMENTS
DE          3615652         11/1987
(Continued)

Primary Examiner—Anh T Mai
(74) Attorney, Agent, or Firm—Horst M. Kasper

(57) ABSTRACT

The invention relates to a preferably ferriteless inductive proximity switch having at least one transmitting coil, one oscillator circuit and at least two receiving coils arranged in the alternating magnetic field of the transmitting coil, whereby the transmitting coil and the receiving coil are arranged adjacent to each other on a printed circuit board, and also having an evaluation circuit connected to the receiving coil for evaluating the received signal of the receiving coils when a target approaches the proximity switch. The receiving coils (E1, E2, Ei, En, 7, 8, 12, 13) as well as the transmitting coil (S, $S_A$, 11) are made up of at least one polygonal or annular or elliptical winding and they each delineate a polygonal or annular or elliptical coil surface area, whereby either the transmitting coil (S, 11) is surrounded by a first receiving coil (E1, 12) which is, in turn, surrounded by a second receiving coil (E2, 13) and optionally, said second receiving coil is surrounded by a third or $n^{th}$ peripheral receiving coil (En), or a first receiving coil (7) is surrounded by the second receiving coil and optionally, said second receiving coil is surrounded by a third or $n^{th}$ receiving coil, whereby the $n^{th}$ receiving coil is peripherally surrounded by the transmitting coil ($S_A$), so that in both alternatives, the coil surface area spanned by the outermost coil in each case completely covers all of the coil surface areas of the other coils situated further towards the inside and moreover, in a perpendicular parallel projection onto the coils, the transmitting coil (S, 11, $S_A$) is at a distance from its closest adjacent receiving coil (E1, E2, 12, 13, En) without the transmitting coils and/or the receiving coils overlapping.

17 Claims, 8 Drawing Sheets

U.S. PATENT DOCUMENTS

Figure 1:
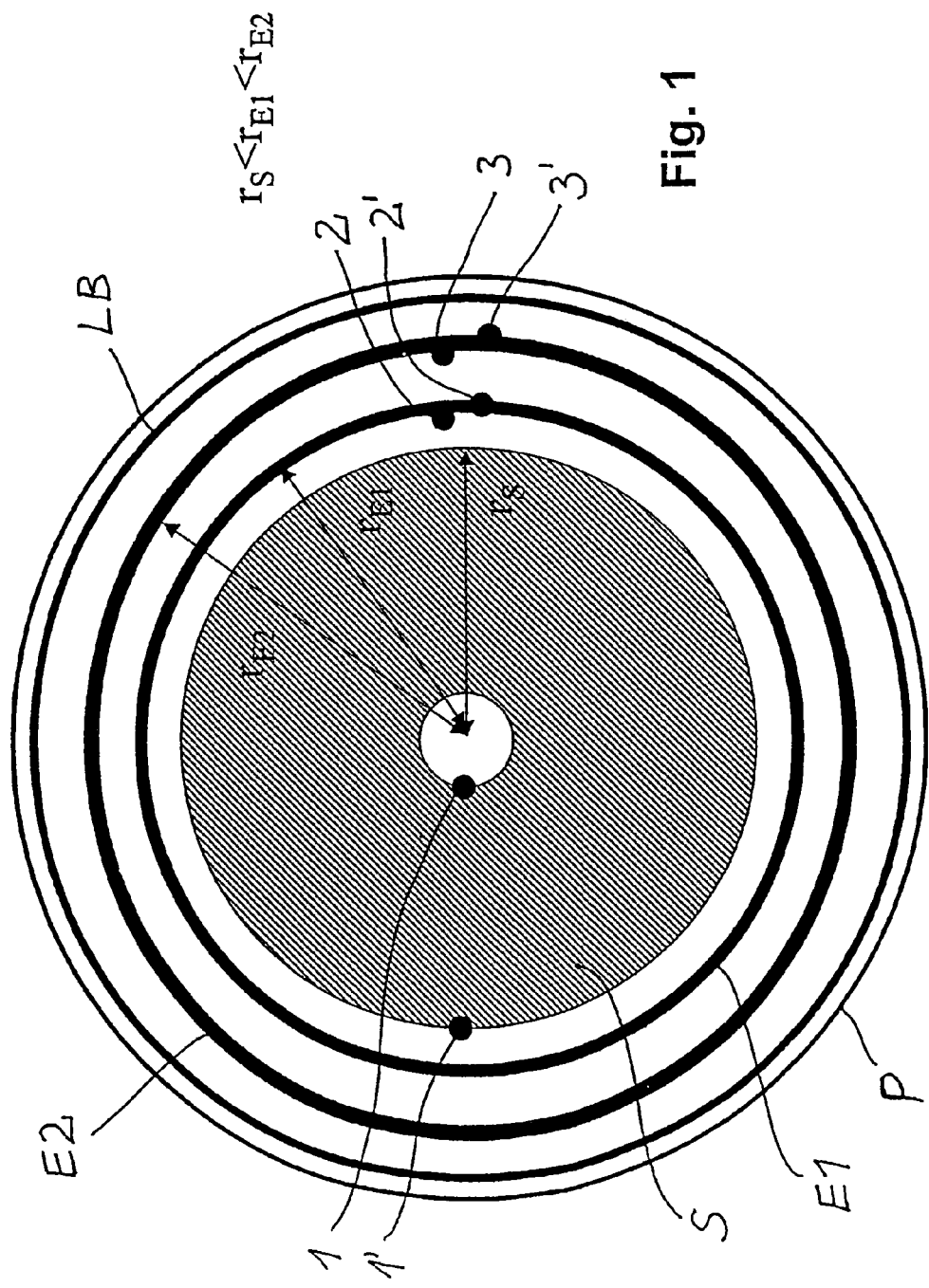

| | | | | |
|---|---|---|---|---|
| 5,801,530 | A * | 9/1998 | Crosby et al. | 324/207.26 |
| 7,106,052 | B2 * | 9/2006 | Ehls et al. | 324/207.12 |
| 7,301,334 | B2 * | 11/2007 | Shen et al. | 324/207.26 |
| 2002/0039023 | A1 * | 4/2002 | Jagiella et al. | 324/207.26 |

FOREIGN PATENT DOCUMENTS

| | | |
|---|---|---|
| DE | 19850749 | 3/2000 |
| DE | 10318350 | 12/2004 |
| EP | 0371261 | 6/1990 |
| JP | 59190718 | 3/1985 |
| JP | 2002148003 | 9/2001 |

* cited by examiner

INDUCTIVE PROXIMITY SWITCH BASED ON A TRANSFORMER COUPLING FACTOR PRINCIPLE

FIELD OF THE INVENTION

The invention relates to an inductive proximity switch based on the transformer coupling-factor principle, having at least one transmitting coil, one oscillator circuit and at least two receiving coils arranged in the alternating magnetic field of the transmitting coil, whereby the transmitting coil and the receiving coil are arranged adjacent to each other on a printed circuit board, and also having an evaluation circuit connected to the receiving coils, whereby, when a target approaches the proximity switch, said evaluation circuit generates a switching signal on the basis of the evaluation of the received signals of the receiving coils, according to the generic part of Claim 1.

DESCRIPTION OF RELATED ART

Inductive proximity switches are sensors that react contact-free, i.e. without direct contact, to the approach of a metal or non-metal object, a target. Two basic principles are known when it comes to structuring inductive proximity switches.

In one case, the core of such a sensor is a current-carrying coil that generates an alternating magnetic field. The alternating current is generated by an oscillator. When a metal object, trigger or target enters this magnetic field, eddy-current losses occur that are caused by the target, and the oscillating circuit is dampened, as a result of which the amplitude of oscillation changes. This change, when electrically amplified, can be used as a measured quantity, for example, for the distance of the target from the coil. Due to a hysteresis effect, the measured quantity when the target moves in the direction of the proximity switch differs from the measured quantity when it moves in the opposite direction. This configuration has fundamental disadvantages, namely, it involves a usually complex construction, a ferrite and a coil winding as well as high tolerance requirements, along with greater switching distances. By the same token, the weld strength is inadequate because the saturation of the ferrite leads to errors.

In another case, instead of one coil, the newer proximity switches use a transformer with a primary coil and a secondary coil that are inductively coupled. The magnitude of the coupling between the primary and secondary coils is referred to as the coupling factor, which can normally be set between 0 (no coupling) and 1 (perfect coupling), whereby the coupling factor K determines the magnitude of the mutual inductivity M of the circuit. A target brought into the switching range of the proximity switch changes the coupling. The coupling evaluation avoids the above-mentioned disadvantages; however, in the prior art, it, in turn, still has the drawback that it is not easy to implement because of the lower signal level.

When it comes to inductive proximity switches, the aim is for the switching distance of a proximity switch at which it responds when a target approaches to be uncritical with respect to external electrical disturbances and especially also for it to be insensitive to being installed in a machine part and to its installation conditions. By the same token, the switching distance should remain constant at different operating temperatures. The reduction factor, which is set at 1 relative to iron, serves to evaluate the switching distance of a proximity switch. Other metals have a smaller reduction factor, which means that here, the switching distance at which the proximity switch responds is shorter than in the case of iron. In today's proximity switches, a constant reduction factor of 1 is desired, which means that all metals have the same or approximately the same switching distance. This can best be achieved with inductive proximity switches based on the transformer coupling principle. Alternatively, it is desired for the proximity switch—at a different reduction factor—to be able to discern the type of metal of which the triggering target is made.

European patent application EP 0 479 078 A2 discloses an inductive proximity switch having an oscillator that feeds a transmitting coil that can be structured with or without ferrite and that generates an alternating magnetic field, whereby the oscillating state of the oscillator is influenced by a metal trigger that penetrates the alternating field, and having an evaluation circuit for acquiring a switching signal from the change in the oscillating state. Two sensor coils are arranged in the alternating field of the transmitting coil as secondary coils in a direct differential circuit for purposes of detecting the difference of the mutual induction voltages induced in the two sensor coils, whereby the sensor coils—due to their spatial position with respect to each other and due to their specific number of windings—are configured in such a way that the differential alternating voltage becomes zero at the desired response distance. Since the two secondary coils are arranged in opposing winding directions, the two induced mutual induction voltages then add up to zero, so that a voltage of zero or almost zero is present at the terminals of the receiving coils. The differential alternating voltage is fed back to the input of the amplifier of the oscillator in such a way that, at a differential alternating voltage of zero, the oscillator abruptly changes its oscillating state. The ring planes of the two secondary coils are in one plane, whereby the secondary coils enclose the transmitting coil in the middle between them in such a way that the sensor coils are equidistant from the transmitting coil. Alternatively, the transmitting coil and the two sensor coils are arranged coaxially with respect to each other in different planes, whereby the transmitting coil is arranged between the two sensor coils. This arrangement is critical in terms of mechanical deformations that can occur during use or if the proximity switch heats up. This, in turn, can result in faulty switching operations as well as in a change in the switching distance. The anti-serial interconnection of the two secondary coils has the disadvantage that the differential voltage is highly temperature-dependent.

Moreover, German patent application DE 103 18 350 B3 describes a ferriteless inductive proximity switch a transmitting coil and having a receiving coil arranged in the alternating magnetic field of said transmitting coil in such a way that the magnetic flux impressed by the alternating magnetic field in the receiving coil is zero or almost zero in the switching position or resting position of the proximity switch, whereby the coils are arranged adjacently offset relative to each other, so that the field lines that emerge from the coil surface of the transmitting coil and that penetrate the coil surface of the receiving coil in one direction also penetrate the coil surface of the receiving coil in the opposite direction. The receiving coil has an annular coil surface area, whereby the transmitting coil has a circular coil surface area whose periphery is overlapped all the way around by the receiving coil. At least one coil is formed by a spiral-shaped printed conductor of a circuit board. The coil surface of the receiving coil is arranged with respect to the alternating magnetic field in such a way that the field lines stemming from the coil surface and passing through the coil surface of the receiving coil also return again through the coil surface of the receiving coil. The result of this is that the magnetic flux generated in the receiving coil, that is to say, the surface integral over the alternating magnetic field, is equal to zero or close to zero there, as a result of which the voltage induced in the receiving coil is equal to zero or is very small, if otherwise no additional alternating fields are present. Moreover, an overlapping of the transmitting coil and the receiving coil means that intersections of the coil windings are present, so that, without being structured using a multilayer technique, such a coil structure cannot be applied onto the very same side of a printed circuit board. Or else, one coil has to be applied onto the top and the other coil onto the bottom of a printed circuit board, which likewise results in a relatively expensive production process, and also limits the application range.

German patent specification DE 19850749 C1 discloses an inductively functioning sensor that responds to the approach of metal parts, having an axially oriented coil system that is installed inside a housing, having at least three coils that are coupled to each other electromagnetically or magnetically, whereby the second coil and the third coil are series-connected as detector coils in such a way as to yield the differential voltage of the individual voltages present in the two coils, and having a first coil connected as the generator coil to a high-frequency generator. The signal present at the detector coil and at the generator coil is fed to a mixer that is a four-quadrant mixer, whereby an integrator is connected to the mixer. The first coil is switched as the detector coil and the second and third coils as generator coils, whereby the fields of the second coil and third coils are reversed with respect to each other. The first coil is arranged between the second and the third coil. From this state of the art, it is a known procedure to structure the coil system using two identically configured circuit boards, whereby a generator coil and a detector coil are mounted onto each individual circuit board. The generator coils are either arranged in the center of the detector coils or else the detector coils are arranged centrally. The coils on the two circuit boards are connected to each other in such a way that, by flipping the circuit boards into the plane or out of the plane until they reach a parallel position, the coils that are series-connected are wound in the same direction or in the opposite direction.

TECHNICAL OBJECTIVE

The invention is based on the objective of creating a preferably ferriteless, inductive proximity switch, based on the transformer coupling-factor principle, of the type described above, that has a virtually material-independent response behavior or a reduction factor of 1 or close to 1, and that can be configured so as to be largely resistant to external constant fields and alternating fields through the capability of dispensing with ferritic materials.

DISCLOSURE OF THE INVENTION AND ITS ADVANTAGES

This objective can be achieved in that the at least two receiving coils, as well as the transmitting coil, are each made up of at least one annular or elliptical or polygonal or spiral winding and they each delineate a circular or annular or polygonal or elliptical coil surface area, whereby either the transmitting coil is peripherally surrounded by the first receiving coil which is, in turn, peripherally surrounded by the second receiving coil—$1^{st}$ alternative—or else the first receiving coil is surrounded by the second receiving coil which is, in turn, peripherally surrounded by the transmitting coil—$2^{nd}$ alternative—so that in both alternatives, in the case of a perpendicular parallel projection onto the coils, the coil surface area spanned by the outermost coil in each case completely covers the coil surface areas of all of the other coils and the coil surface area spanned by the innermost coil is completely covered by the coil surface areas of all of the other coils, and moreover, in a perpendicular parallel projection onto the coils, the transmitting coil is at a distance from its adjacent receiving coil without the projections of the coils overlapping.

In another embodiment of the invention having more than two receiving coils, the second receiving coil can be surrounded by a third and optionally by one or more peripheral receiving coils, whereby in the second alternative of Claim 1, the outermost receiving coil is peripherally surrounded by the transmitting coil.

Hence, either the transmitting coil is surrounded by a first receiving coil which is, in turn, surrounded by the second receiving coil which is optionally surrounded by a third or $n^{th}$ peripheral receiving coil, or else a first receiving coil is surrounded by a second receiving coil which is optionally surrounded by a third or $n^{th}$ receiving coil, whereby the $n^{th}$ receiving coil is peripherally surrounded by the receiving coil, so that in both alternatives of Claim 1, the coil surface area spanned by the outermost coil in each case completely covers all of the coil surface areas of the coils situated further towards the inside and moreover, in the perpendicular parallel projection onto the coils, the transmitting coil or every other coil is at a distance from its closest adjacent receiving coil without the perpendicular projections of the transmitting coils and/or receiving coils overlapping or intersecting. The term "coil surface area" refers to the surface area spanned by each coil in a perpendicular projection.

The inductive proximity switch according to the invention has substantial advantages in comparison to the state of the art. The proximity switch has a virtually material-independent response behavior or a reduction factor of 1 or close to 1, and it is resistant or almost resistant to external constant fields and alternating fields due to the fact that it largely dispenses with ferritic materials, and thus, it has a high weld strength in applications without ferrite. Moreover, the proximity switch according to the invention achieves high switching distances and, through the use of inexpensive circuit board coil systems, the inventive proximity switch makes it possible to avoid complex, mechanically intricate and cost-intensive multi-coil systems employing conventional winding technology, which are associated with the problems of inadequate stability and reproducibility. In particular, the production of the proximity switch can dispense with multilayer circuit boards, even though they can, of course, be used in special instances. Moreover, the proximity switch according to the invention allows a high signal level to be obtained and is easy to implement.

Furthermore, with the proximity switch according to the invention, print coil arrangements exhibiting high temperature stability and reproducibility can be implemented. The reason for this is that, with the proximity switch according to the invention, all of the conductor structures have a planar arrangement, and there is little or no overlapping in a perpendicular projection of the coils onto each other. The transmitting coils and the receiving coils preferably do not overlap, and by the same token, the receiving coils preferably do not overlap. The arrangement of the transmitting coils and the receiving coils according to the invention with little or no overlapping causes the magnetic fluxes that are generated by the transmitting coil in the receiving coils not to be zero or close to zero but rather, these magnetic fluxes always differ markedly from zero and consequently yield induction voltages that can be evaluated. The flux, integrally over the receiving coil surfaces, always differs markedly from zero.

Hence, a lower CTE of the circuit board in the plane exists and so does an independence from layer distances.

Moreover, the geometries of the coils are not limited to a circular or annular shape but instead, practically any shape can be used such as polygonal or annular or elliptically wound or shaped winding forms and coil surface forms.

In another embodiment of the proximity switch according to the invention, the outermost coil—the receiving coil or transmitting coil—is surrounded by a peripherally arranged closed printed conductor, whereby additionally, a closed printed conductor can be situated between adjacent receiving coils. Instead or additionally, at least one closed printed conductor can be situated between adjacent receiving coils. Consequently, the proximity switch according to the invention opens up especially the possibility of distinguishing between influences exerted by the installation and influences exerted by the target, which is associated with a decisive improvement in achieving a flush installation of the proximity switch; the proximity switch remains virtually unaffected by its installation in a machine part or by its installation conditions.

The use according to the invention of at least two or more receiving coils that are independent of each other opens up the possibility of evaluating their signals separately or of linking them, allowing, for example, a linear combination or the formation of ratios of the two signals or of several signals. This is possible because the magnetic fluxes in the receiving coils are not zero or close to zero, but rather always differ markedly from zero and consequently yield induction voltages that can be evaluated.

In another embodiment of the proximity switch according to the invention, the windings of the transmitting coil and of the receiving coils are arranged basically so as to be spiral and planar lying in one plane. In this manner, printed coils can easily be produced.

In another embodiment of the proximity switch according to the invention, the transmitting coil is circular, that is to say, distributed over a circle area; the receiving coils are configured so as to be annular, whereby they peripherally surround the transmitting coil. Alternatively, the inner first receiving coil is either circular, that is to say, distributed over a circle area, or else annular, and the other receiving coils surrounding the first receiving coil, including the outermost transmitting coil, are each annular coils, whereby in both alternatives, as seen in a perpendicular parallel projection onto the coils, they are at a distance from each other or else they can touch each other.

If the coil surface area and the windings of the coils are, for example, polygonal or elliptical in shape, then the coils thus formed are basically in the form of hollow polyhedrons or hollow ellipsoids or the windings of the coils span polyhedrons or ellipsoids that are as high as the winding is thick.

In another embodiment of the proximity switch according to the invention, underneath a coil arrangement, at least one more identical coil arrangement is situated in another plane, as seen in a perpendicular parallel projection onto said coil arrangement, whereby as a result, the coils of the coil arrangement are divided on different planes into partial coils that are connected to each other conductively, each of these partial coils being arranged congruently over each other and being connected one behind the other, namely, in series, in the same direction, and they carry current in the same direction. Alternatively, only the transmitting coil is divided into partial coils that are preferably connected in series and that are arranged in two planes one above the other, preferably congruently, and they carry current in the same direction.

In another embodiment of the proximity switch according to the invention, the voltage signals being generated in the receiving coils on the basis of the magnetic flux changes can be evaluated in the evaluation circuit according to the differential principle.

In another embodiment of the proximity switch according to the invention, it has a cylindrical structure with a metal sleeve as well as concentric conductor structures of its coils. In an embodiment of the proximity switch according to the invention, the conductor structures, especially those of the receiving coils, can be open rings. Moreover, at least one of the coils, namely, the transmitting coil and/or the receiving coils, can be formed by a spiral printed conductor situated on or in a printed circuit board.

Normally, the proximity switch according to the invention is structured without ferrite, as a result of which it has a high weld strength. In special application cases, however, a proximity switch according to the invention having a ferrite can be used, whereby the ferrite is arranged, for example, as a disk, preferably a thin one, underneath the transmitting coil, especially in a recess on the printed circuit board, or else on or in the printed circuit board. This allows suitable and adapted field modeling.

In another embodiment of the proximity switch according to the invention, the projections of the transmitting and/or receiving coils can also overlap or intersect slightly, which can sometimes be favorable from the standpoint of production technology. By the same token, the peripheral area of the coils, it is also possible to accept slight overlapping of the projection of the coils in the peripheral area of the coils, without this diminishing the advantages of the proximity switch according to the invention.

Through a suitable selection of the radii of the coils, the influence of the installation damping of the proximity switch according to the invention can be largely reduced so that, if the received voltages of the receiving coils are suitably linked in an evaluation circuit, the resultant output signal is virtually only influenced by the target. Thus, the possibility exists of distinguishing between influences exerted by the installation and influences exerted by the target, which leads to a decisive improvement in achieving a flush installation of the proximity switch.

In another embodiment of the proximity switch according to the invention, diverging from Claim 1, the transmitting and/or receiving coils touch each other or else they overlap slightly in the projection, so that, in the case of insulated windings, the coils can touch each other or, in their projection, can intersect each other. With this space-saving design, the advantages of the proximity switch according to the invention are retained.

In another embodiment of the proximity switch according to the invention, the transmitting coil, diverging from Claim 1, is arranged between two receiving coils, whereby at least two receiving coils are present.

BRIEF DESCRIPTION OF THE DRAWING, WHICH SHOWS THE FOLLOWING

Figure 1A:
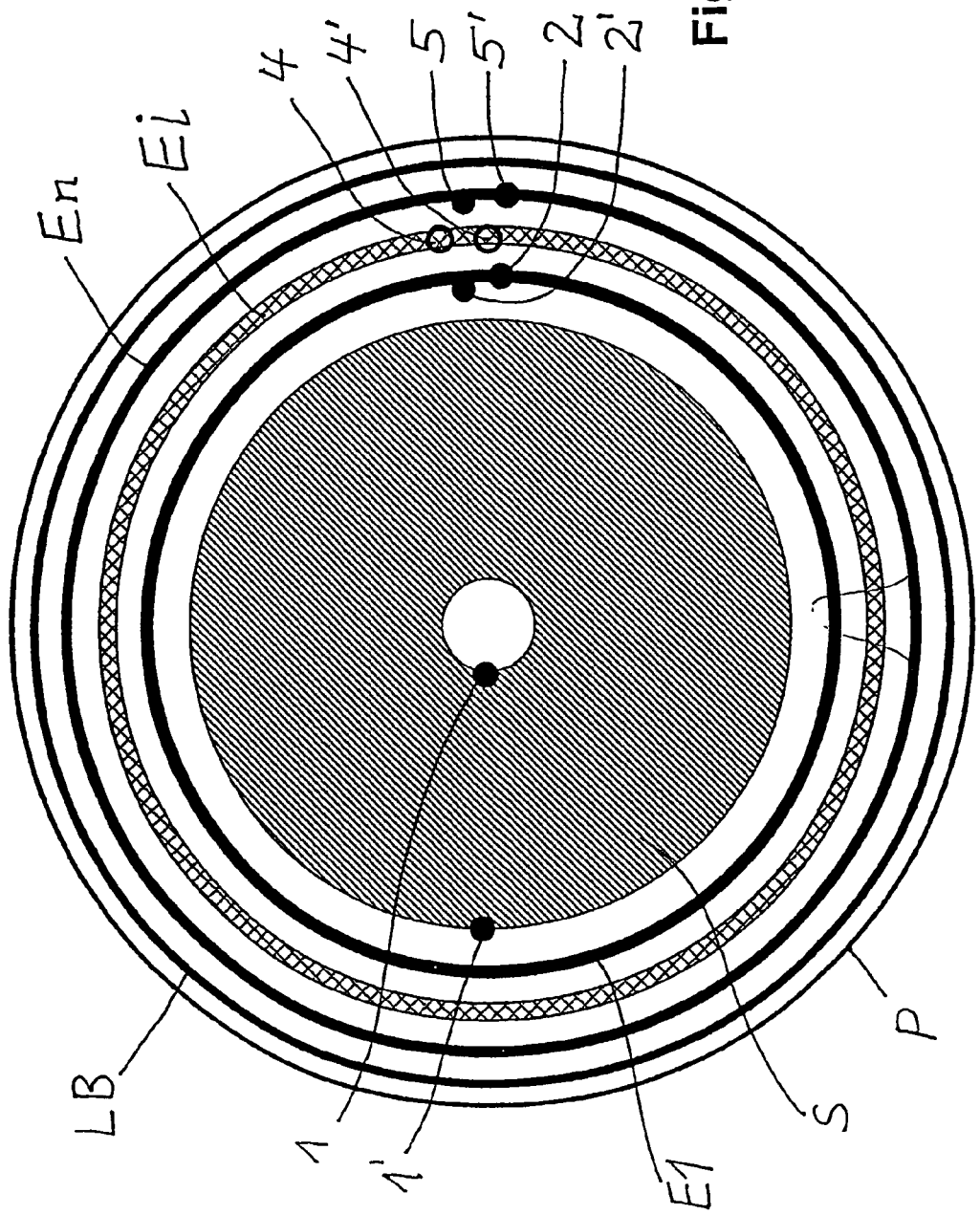
Figure 2:
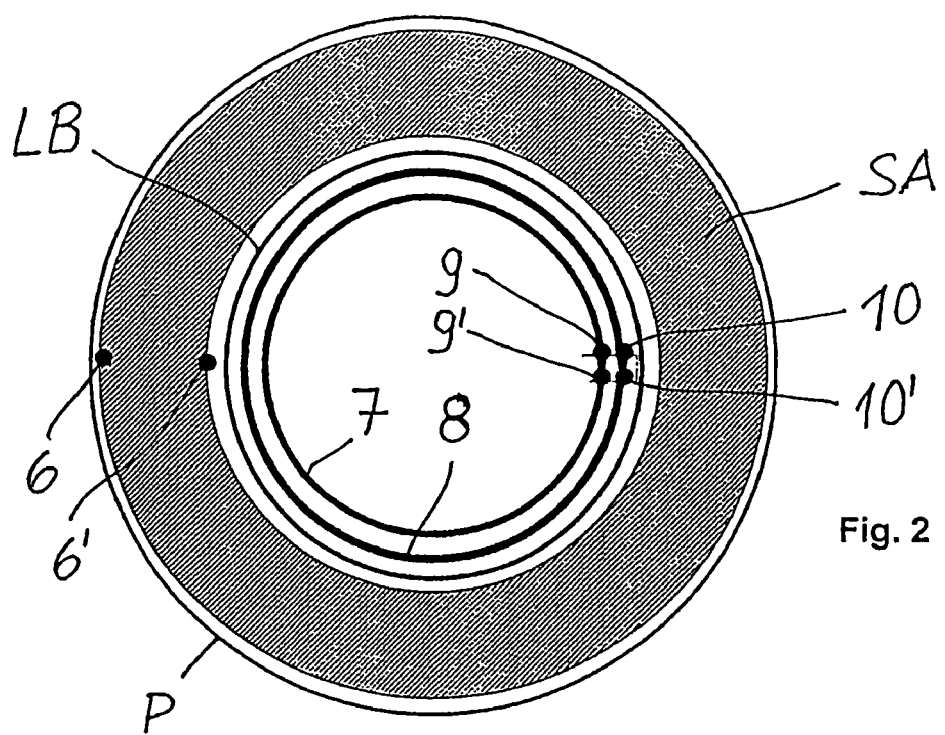
Figure 3:
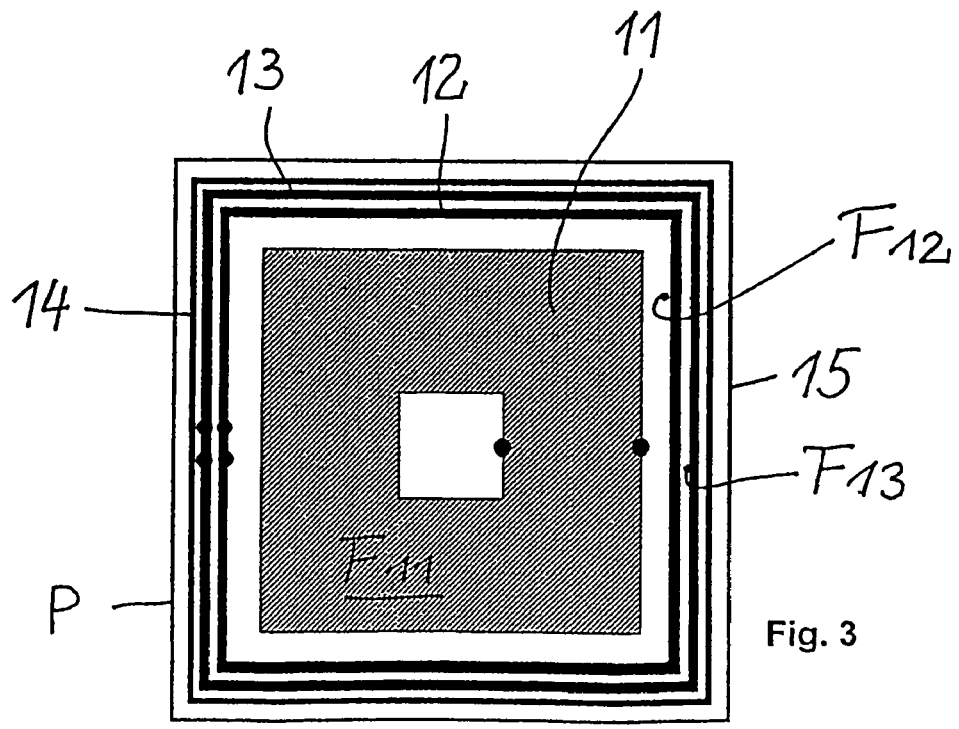
Figure 4:
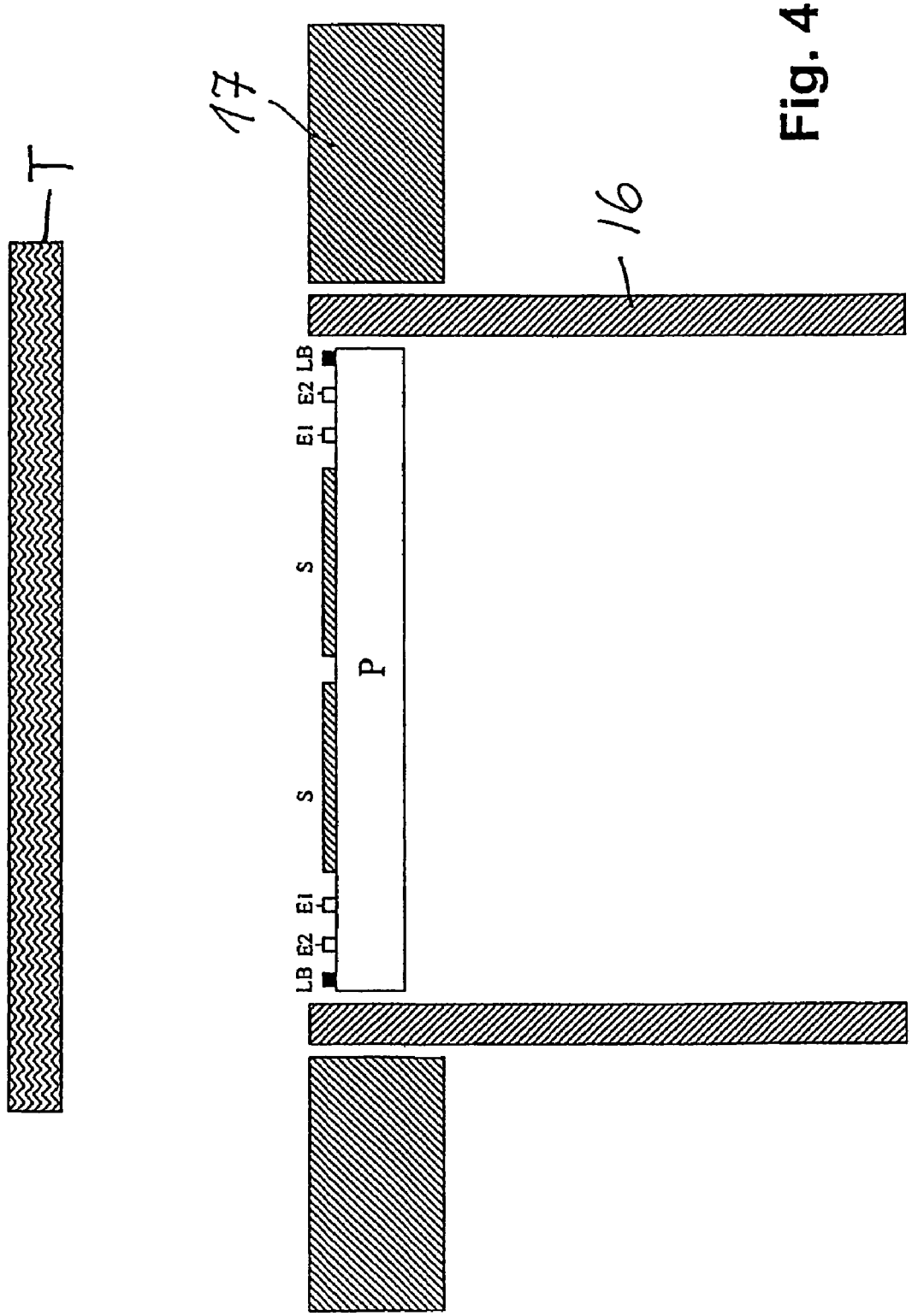
Figure 5:
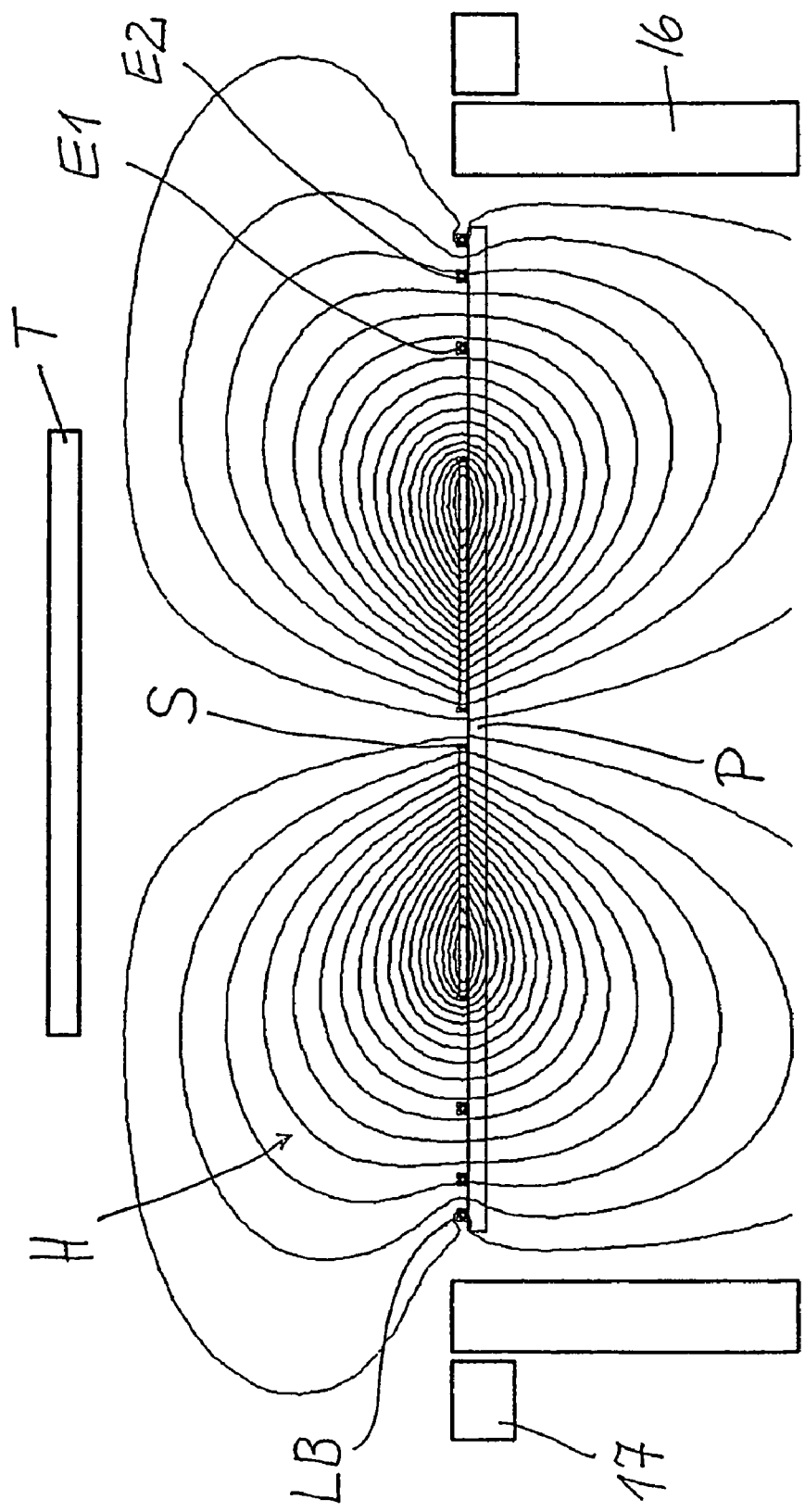
Figure 6:
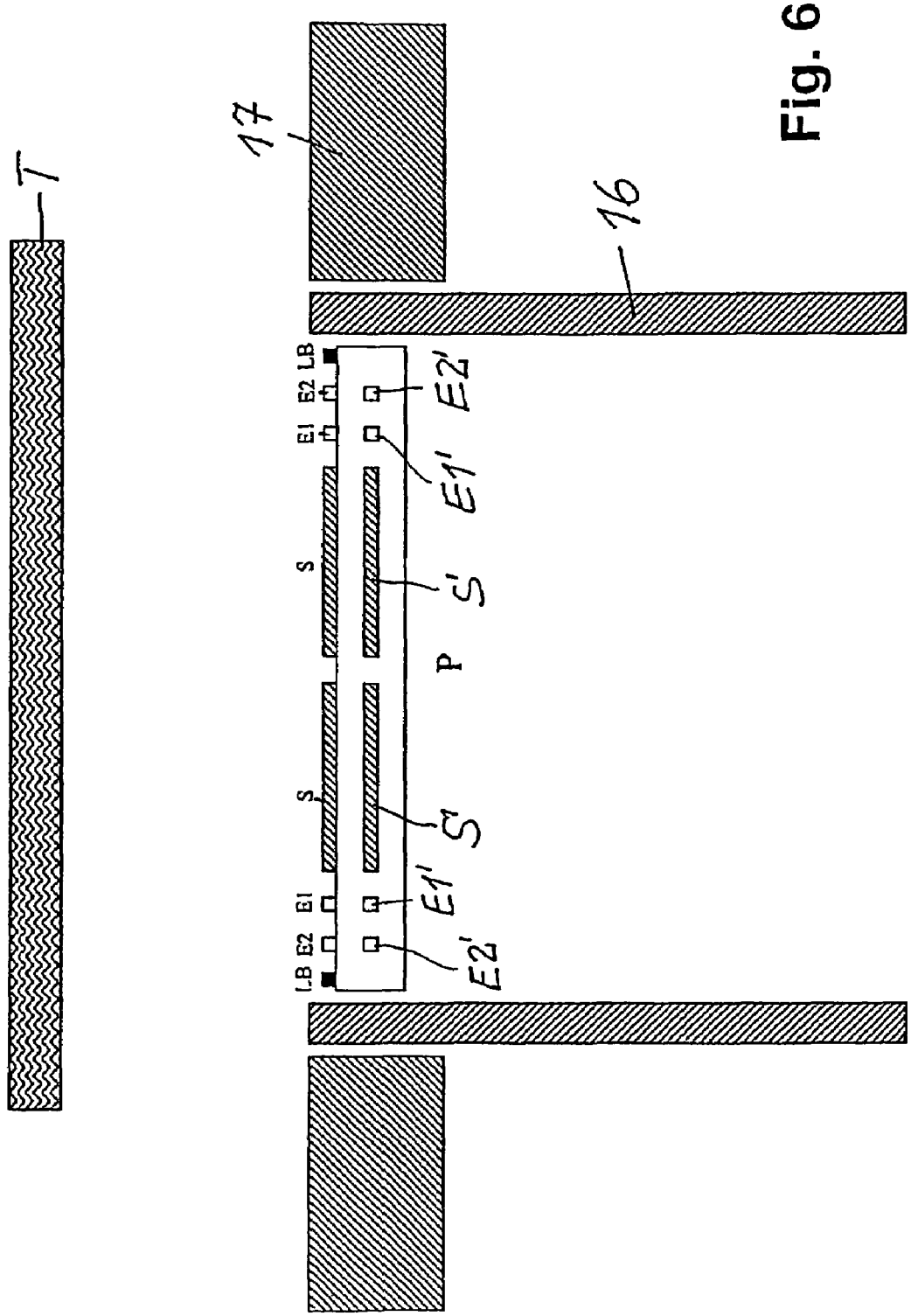
Figure 7:
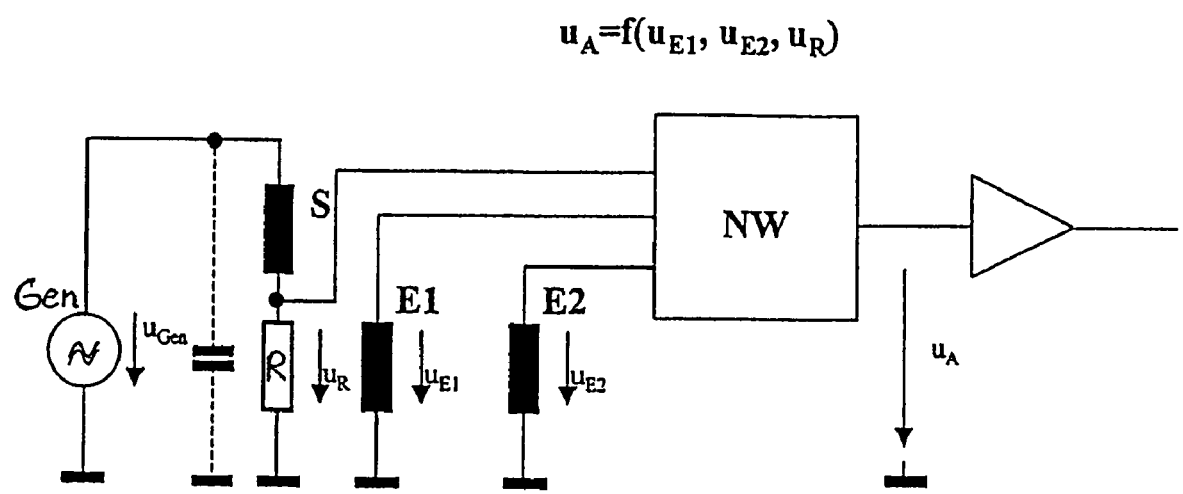
Figure 8:
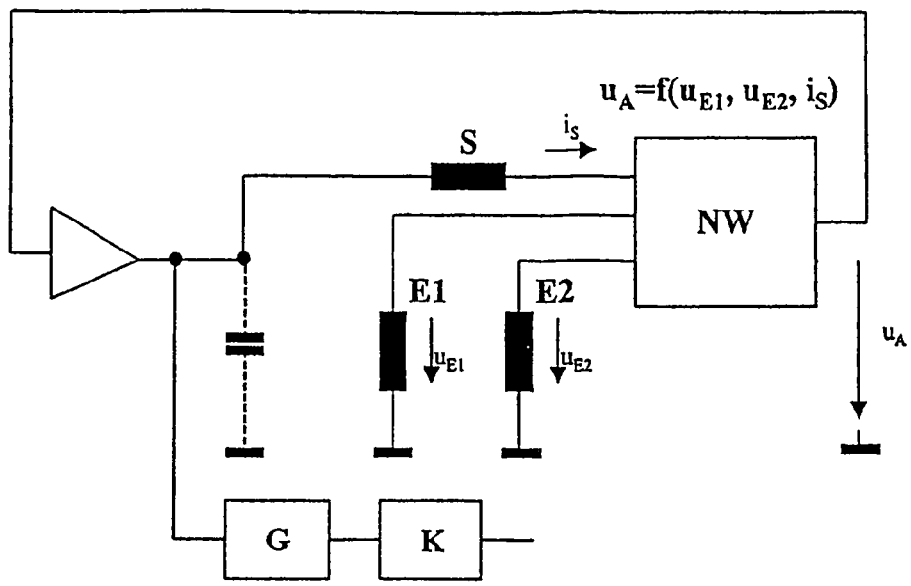
Figure 9:
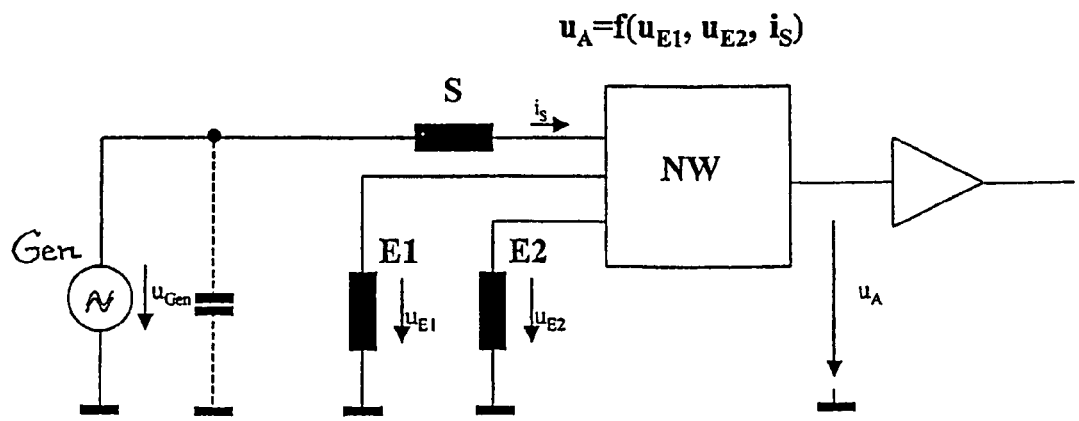

FIG. 1 the basic principle of the structure of a proximity switch according to the invention in a top view of a printed circuit board having a transmitting coil that is essentially shaped like a circle, whereby it has a spiral winding, as well as two hollow-cylindrical receiving coils surrounding it as well as a closed short-circuit printed conductor running peripherally around the receiving coils, FIG. 1a a depiction of the coils similar to that of FIG. 1, whereby another receiving coil between the inner and outermost receiving coils is shown with a broken line in order to indicate a plurality of additional possible receiving coils, FIG. 2 another depiction of a coil arrangement in which the annular transmitting coil is arranged peripherally on the outside and the receiving coils are arranged so as to be surrounded by said transmitting coil, FIG. 3 another depiction of a coil arrangement, whereby, in order to symbolically show that practically any shape is possible, the windings of the coils are configured to be polygonal and square, FIG. 4 a cross section through a coil arrangement according to FIG. 1 inside a housing of the proximity switch, which is installed flush in a machine part, FIG. 5 the course of the magnetic field H generated by the transmitting coil of FIGS. 1 and 4, FIG. 6 a schematic cross section through another proximity switch that, in two planes one above the other, has identically structured coil arrangements that are contacted and that carry current in the same direction in order to increase the number of windings of the individual coils, FIG. 7 a circuitry example of an evaluation circuit for evaluating the signals from the receiving coils, FIG. 8 another circuitry example of an evaluation circuit for evaluating the signals from the receiving coils, and FIG. 9 an alternative circuitry example of another evaluation circuit.

WAYS TO CARRY OUT THE INVENTION

FIGS. 1 and 1a show the fundamental structure of an arrangement according to the invention of a transmitting coil S and of a plurality of receiving coils E1 and E2 on a circular printed circuit board P. The transmitting coil S is preferably a flat coil having a radius $r_S$ and a circular coil surface area $F_S$ and having windings that are wound essentially spirally (not shown here) and also having the coil ends 1, 1'. The annular receiving coil E1 has windings that are wound essentially spirally or circularly, preferably in the form of a printed flat coil having the coil ends 2, 2'; likewise, the annular receiving coil E2 has windings that are wound essentially spirally to circularly, preferably in the form of a printed flat coil having the coil ends 3, 3'. In the example shown, the receiving coils E1 and E2 are arranged in a plane approximately concentrically around the transmitting coil S. The radius $r_{E1}$ of the receiving coil E1 is greater than the maximum radius $r_S$ of the transmitting coil S; the radius $r_{E2}$ of the receiving coil E2 is greater than the radius $r_{E1}$ of the receiving coil E1, so that the receiving coils are arranged approximately concentrically around the transmitting coil and the following relationship applies: $r_S < r_{E1} < r_{E2}$. Consequently, the projections of the coils do not overlap. Each coil can also consist of just one single winding that can also have the shape of an open ring. Therefore, the coil surface area spanned by the second receiving coil, seen in a projection, completely covers the coil surface areas spanned by the first receiving coil and by the transmitting coil. Likewise, the coil surface area spanned by the first receiving coil completely covers the coil surface area spanned by the transmitting coil, seen in a projection.

In other words, the requirement that the projections of the coils not overlap means that, in a perpendicular projection, the coils do not touch each other or intersect, as can be seen, for example, in FIG. 1, but rather as shown in FIG. 1, they are concentric and at a distance from each other. However, a slight overlapping or a slight intersecting or touching of the coils, relative to the perpendicular projection, is possible and permissible; here, the advantages of the proximity switch are largely retained. In contrast, the coil surfaces overlap since, for example, according to FIG. 1, the coil surface of the inner receiving coil is arranged within the coil surface of the outermost receiving coil and the coil surface of the transmitting coil is situated in said inner receiving coil. Therefore, the coil surface of each coil, except for the outermost coil, is completely within the coil surface areas of all of the other coils situated further towards the outside.

FIG. 1a shows a representation of a coil arrangement similar to that of FIG. 1, consisting of the printed circuit board P on which the transmitting coil S having the coil ends 1, 1' is arranged, whereby another receiving coil Ei having the coil ends 4, 4', drawn with a broken line, is shown between the first receiving coil 1 having the coil ends 2, 2', which is directly adjacent to the transmitting coil S, and the outermost receiving coil En having the coil ends 5, 5', in order to symbolically indicate a plurality of possible additional, similarly configured receiving coils, namely, from E1 to En with the consecutive index (i=2, 3, 4, . . . n), that is to say, n receiving coils can be present that surround the transmitting coil S concentrically or approximately concentrically and that, together, lie in one plane with said transmitting coil S.

As shown in another coil arrangement in FIG. 2, the arrangement of the transmitting and receiving coils is interchangeable, so that a transmitting coil $S_A$ is situated peripherally on the outside on a printed circuit board P and it has an annular coil having the coil ends 6, 6'. The two likewise annular receiving coils 7, 8 having the coil ends 9, 9' or 10, 10', respectively, are concentrically enclosed by the transmitting coil $S_A$.

The shape and arrangement of the coils do not have to be concentric but rather they can have practically any shape; this can also be, for instance, elliptical or polygonal. In this context, a representation of a coil arrangement on a square printed circuit board P can be seen in FIG. 3, whereby the windings of all of the coils 11, 12, 13 are polygonal in shape and, for example, square; the reference numeral 14 designates a closed, peripherally arranged printed conductor. The only decisive aspect is that the surface area enclosed by the outermost coil has to—preferably completely—cover the coil surface areas of the further coils that follow towards the inside, and consequently, the coil of the outermost coil completely encloses the coil of the further coils that are adjacent towards the inside, whereby the innermost receiving coil completely encloses the coil $F_S$ of the transmitting coil 11: $F_{11(S)} < F_{12} < F_{13}$. In other words, this means that the surface of each coil completely covers the surface all of the coils situated further towards the inside. The configuration of the coil arrangement according to FIG. 2, if the transmitting coil is the peripherally running coil and encloses the receiving coils, can be configured as a polygon.

Hence, FIGS. 1 and 2 show the fundamental structure of a circuit board-coil system according to the invention with reference to the example of a cylindrical proximity switch with a cylindrical-symmetrical structure, preferably with a metal sleeve (not shown). Fundamentally, the cylindrical-symmetrical arrangement with concentric conductor structures can be replaced by an arrangement with, for example, fourfold symmetry in order to design a sensor with a square front face according to FIG. 3.

The central components are at least three conductor structures that are applied onto a circuit board P and that are operated as transmitting coils or receiving coils. The coils in FIGS. 1, 1a and 2 are arranged concentrically with respect to each other, preferably spirally, and they are situated in one plane. The transmitting coil S is preferably a spirally applied coil with a plurality of windings having the outer radius $r_S$ and any desired inner radius.

The receiving coils E1 and E2 each consist of at least one winding, optionally also of several windings arranged closely adjacent to each other in the radial direction, with the middle radius $r_{E1}$ or $r_{E2}$, respectively. Due to the planar arrangement of the coils, there is preferably no spatial overlapping of the projections of the coils. The coil ends can be contacted, for example, by means of through-contacting and corresponding solder surfaces on the opposite main surface of the printed circuit board.

Moreover, optionally, at least one concentrically arranged, continuous and annularly closed printed conductor LB is provided that either peripherally surrounds all of the coils or that is arranged within the innermost coil or else that is situated between two adjacent coils, as is shown in some of the figures.

FIG. 4 schematically shows a cross section through a coil arrangement according to FIG. 1 within a housing 16 of a proximity switch that is installed flush in a machine part 17; a metal target T is situated above the proximity switch as well as above the machine part 17, and when said target T approaches into the switching distance of the proximity switch, it is capable of triggering a reaction or response. Here, the oscillation of the oscillator depends on the position of the target. Fundamentally, two modes of operation of the proximity switch are possible. One possibility is that, if no target T is present, the oscillator oscillates due to a slight alternating field induced in the receiving coil. Through the approach of the target, once the switching distance is reached, this field is disturbed or reduced in such a way that the oscillation of the oscillator is stopped. Another possibility is that the oscillation of the oscillator only starts once the target reaches the switching distance. The mode of operation depends on the selected oscillator circuit.

FIG. 5 shows the course of the alternating magnetic field H generated by the transmitting coil S of FIGS. 1 and 4 as well as the penetration of the surfaces of the receiving coils E1 and E2 by the alternating field H. Here, it is evident that the alternating field H of the transmitting coil S, which is very wide, only spreads negligibly over the closed, peripherally arranged printed conductor LB and it is constricted by the short-circuited printed conductor so that a systematic modeling of the alternating magnetic field can be achieved due to this printed conductor LB and its placement more or less peripherally on the printed circuit board P. Due to the closed printed conductor LB, which constitutes a short-circuit, it is also achieved that different voltages are induced in the receiving coils, not only because of their different radii but, to an even greater extent, because of the field modeling by the printed conductor LB. As a matter of principle, at least one annularly closed printed conductor can be present between every two adjacent coils.

FIG. 6 shows a schematic cross section through another proximity switch that, in two planes one above the other, has identically structured coil arrangements that are contacted with each other in order to increase the number of windings of the individual coils. The transmitting coil consists of the two parts S and S', and these two parts are connected in such a way that the alternating magnetic fields of the two partial coils S and S' amplify each other. By the same token, the receiving coils are made up of two parts E1 and E1' or E2 and E2', respectively, whereby the individual partial coils preferably have the same number of windings. Thus, the coil arrangements or conductor structures or partial coils can be offset in the axial direction and can be reproduced one or more times, for example, in interlayers of a multilayer circuit board, and they are connected together in such a way that the coils are connected one behind the other in the same direction.

It should be pointed out that the transmitting coil and the receiving coils can preferably extend close to each other without touching. However, the coils can also touch each other in the case of insulated windings or else they can slightly overlap as seen in a perpendicular projection.

In order to explain the physical mode of operation of the coil arrangement according to the invention, once again, reference is made to FIGS. 1 and 4.

When an alternating current i is applied to the transmitting coil S and when a sufficiently conductive object—the target T or installation material—is placed into the resulting alternating field H—the primary field—then an eddy current is generated within the target and, as a result, a field change occurs, which ultimately leads to the switching of the inductive proximity switch once a given threshold is reached. The following effects occur in this process:

- reduction of the mutual inductivities $M_{SE1}$ or $M_{SE2}$ between S and E1 or E2
- reduction of the transmitting coil inductivity $L_S$
- the occurrence of a dissipative component in the field (field component that is phase-shifted by 90° relative to the excitation current i) due to the dissipative losses in the object. This field component induces voltages in the transmitting and receiving coils that are in-phase with the excitation current and, as a result, this field component is responsible for the occurrence of the transformer losses.

As an essential effect, the change $\Delta M_{SE1}$ or $\Delta M_{SE2}$ in the mutual inductivities should be considered. It exhibits two important properties:

- At given damping conditions such as target position and installation geometry, as the frequency of the alternating field increases, $\Delta M$ as well as $\Delta M_{SE1}$ and $\Delta M_{SE2}$ strive towards a limit value that is independent of the target or installation material (presupposing a minimum conductivity). Thus, based on typical metal damping materials, a material-independence of the response behavior is obtained, namely, reduction factor 1. Depending on the design, the operating frequencies to be aimed for lie between a few 100 kHz and several MHz.
- The evaluation of the mutual inductivities between the transmitting coil and two independent receiving coils allow a distinction between the influences exerted by the installation and the influences exerted by the target, and thus an elimination of the installation influence (installation jump).

By suitably selecting the radii $r_{E1}$ and $r_{E2}$ of the receiving coils E1 and E2, it can be achieved that, in case of installation damping, the received voltages $u_{E1}$ and $u_{E2}$ change by the same amount $\Delta u$, so that the following applies:

$$u_{E1} \rightarrow u_{E1} - \Delta u$$

$$u_{E2} \rightarrow u_{E2} - \Delta u$$

If one observes the differential voltage $u_{diff} = u_{E1} - u_{E2}$, then no change in $u_{diff}$ results from the installation damping. In contrast, in case of damping by the target, the received voltages change by different amounts $\Delta u_{E1}$ and $\Delta u_{E2}$:

$$u_{E1} \rightarrow u_{E1} - \Delta u_{E1}$$

$$u_{E2} \rightarrow u_{E2} - \Delta u_{E2}$$

This results in a change in the differential voltage according to:

$$u_{diff} = \Delta u_{E2} - \Delta u_{E1}$$

This means that only a target-specific damping brings about a change in the differential voltage.

The differential voltage can be formed in an extremely simple manner by anti-serially interconnecting the receiving coils. However, it is also conceivable to detect and evaluate the two received voltages separately from each other or else to link them to each other in a linear or non-linear network and then to evaluate the resultant output signal.

Consequently, by suitably selecting the radii $r_{E1}$ and $r_{E2}$ of the receiving coils, it is achieved that, in case of installation damping, the received voltages $u_{E1}$ and $u_{E2}$ in the receiving coils E1 and E2 change by the same amount Δu and thus are converted into a "common-mode" signal. Through a suitable signal evaluation according to the state of the art, this effect can thus be eliminated.

In case of damping with the target, the received voltages $u_{E1}$ and $u_{E2}$ change by different amounts $\Delta u_{E1}$ and $\Delta u_{E2}$, whereby the individual voltages as well as any difference also differ markedly from zero. Therefore, by suitably selecting the radii of the receiving coils, the influence of the installation damping can be largely reduced, so that, by suitably linking the received voltages in a network, the resultant output signal depends practically only on the influence exerted by the target.

It is possible to detect and evaluate the received voltages separately from each other or else to link them to each other in a linear or non-linear network and to then evaluate the resultant output signal.

Possible circuit diagrams of such evaluation circuits are shown in FIGS. 7 to 9. FIG. 7 shows a circuitry example of an evaluation circuit in which the transmitting coil S that is fed by an oscillator generator Gen is series-connected to a detector resistor R. The voltage $u_R$ that drops over the resistor R as well as the voltages $u_{E1}$ and $u_{E2}$ that are induced in the receiving coils E1 and E2 are fed to the network NW, amplified and linked to each other there.

FIG. 8 shows the circuit diagram of another evaluation circuit. The current $i_s$ of the transmitting coil S, which is fed by an oscillator generator G that supplies the transmitting coil S with a high-frequency alternating voltage, as well as the voltages $u_{E1}$ and $u_{E2}$ that are induced in the receiving coils E1 and E2 are fed to a network NW, amplified there and linked to each other; the output signal, $u_A=f(u_{E1}$ and $u_{E2}, i_S)$, is fed back to the transmitting coil.

FIG. 9 shows an alternative circuitry example of another evaluation circuit without feedback.

A proximity switch is characterized, for example, by the following quantities. When two receiving coils E1, E2 and one transmitting coil S are used, the outer radius $r_S$ of the transmitting coil S relates to the radii $r_{E1}$, $r_{E2}$ of the receiving coils E1, E2 as follows: 3.75 mm-$r_S$: 4.7 mm-$r_{E1}$: 6.7 mm-$r_{E2}$±25% tolerance.

If a peripheral printed conductor LB is present and at a scaling factor of 1, the radius ($r_{LB}$) of the printed conductor (LB) at the radii ($r_{E1}$, $r_{E2}$) of the receiving coils (E1, E2) is 3.75 mm($r_S$): 4.7 mm($r_{E1}$): 6.7 mm($r_{E2}$)±25% tolerance, 7.1 mm.

INDUSTRIAL APPLICABILITY

The subject matter of the invention is especially well-suited for structuring ferriteless proximity switches that are preferably ferriteless, but that can also have a ferrite for special application purposes.

The invention claim is:

1. An inductive proximity switch based on the transformer coupling-factor principle, having at least one transmitting coil, one oscillator circuit and at least two receiving coils arranged in the alternating magnetic field of the transmitting coil, whereby the transmitting coil and the receiving coil are arranged adjacent to each other on a printed circuit board, and also having an evaluation circuit connected to the receiving coils, whereby, when a target approaches the proximity switch, said evaluation circuit generates a switching signal on the basis of the evaluation of the received signals of the receiving coils, characterized in that the at least two receiving coils (E1, E2, Bi, En, 7, 8, 12, 13) and the transmitting coil (S, $S_A$, 11) are each made up of at least one annular or elliptical or polygonal or spiral winding and each delineate a circular or annular or polygonal or elliptical coil surface area, whereby the transmitting coil (S, 11) is peripherally surrounded by the first receiving coil (E1, 12) which is, in turn, peripherally surrounded by the second receiving coil (E2, 13) or the first receiving coil (7) is surrounded by the second receiving coil (8) which is, in turn, peripherally surrounded by the transmitting coil ($S_A$);

in the case of a perpendicular parallel projection onto the coils, the coil surface area spanned by the outer-most coil in each case completely covers the coil surface areas of all of the other coils and the coil surface area spanned by the innermost coil is completely covered by the coil surface areas of all of the other coils, and moreover, in a perpendicular parallel projection onto the coils, the transmitting coil (S, 11, $S_A$) is at a distance from its adjacent receiving coil (E1, E2, 12, 13, En) without the projections of the coils overlapping.

2. The proximity switch according to claim 1, characterized in that the second receiving coil is surrounded by a third and optionally by one or more ($i^{th}$, ..., $n^{th}$) peripheral receiving coils (En), whereby, each receiving coil is peripherally surrounded by the transmitting coil ($S_A$).

3. The proximity switch according to claim 1, characterized in that the outermost coil is surrounded by a peripherally arranged closed printed conductor (LB) or a closed printed conductor (LB) is situated between at least two adjacent receiving coils.

4. The proximity switch according to claim 1 characterized in that the windings of the transmitting coil and of the receiving coils are each arranged so as to be spiral and planar lying in one plane.

5. The proximity switch according to, claim 1 characterized in that the transmitting coil (S) is a circular or annular coil and the receiving coils (E1, E2, En) are each an annular coil surrounding the transmitting coil (S) or the inner first receiving coil (7) is a circular or annular coil and the other receiving coils (8) surrounding the first receiving coil and the peripheral transmitting coil are each annular coils, whereby as seen in a perpendicular parallel projection onto the coils, they are at a distance from each other.

6. The proximity switch according to, claim 1 characterized in that underneath a coil arrangement according to claim 1, at least one more identical coil arrangement is situated in another plane, as seen in a perpendicular parallel projection onto said coil arrangement, and as a result, the coils of the coil arrangement are divided on different planes into partial coils that are connected to each other conductively, whereby the partial coils belonging to each coil are arranged congruently over each other and are connected one behind the other in the same direction and they carry current in the same direction.

7. The proximity switch according to, claim 1 characterized in that only the transmitting coil is divided into partial coils (S, S') that are preferably connected one behind the other, in series, in the same direction and that are arranged in two planes one above the other, preferably congruently, and they carry current in the same direction.

8. The proximity switch according to, claim 1 characterized in that at least one of the coils, namely, the transmitting coil and/or the receiving coils, is formed by a spiral printed conductor situated on or in a printed circuit board (P).

9. The proximity switch according to, claim 1 characterized in that the signals being generated in the receiving coils on the basis of the magnetic flux changes are evaluated in the evaluation circuit according to the differential principle.

10. The proximity switch according to, claim 1 characterized in that it has a cylindrical structure with a metal sleeve (16) as well as concentric conductor structures of its coils (S, E1, E2).

11. The proximity switch according to claim 1 characterized in that it is structured without ferrite.

12. The proximity switch according to claim 1 characterized in that a ferrite disk is arranged underneath the transmitting coil for purposes of field modeling.

13. The proximity switch according to claim 1 characterized in that, the transmitting and/or receiving coils touch each other or they overlap slightly in the perpendicular projection, so that the coils can intersect in the perpendicular projection.

14. The proximity switch according to claim 1 characterized in that the transmitting coil, is arranged between two receiving coils.

15. The proximity switch according to claim 1 characterized in that, by appropriately selecting the radii ($r_{E1}$, $r_{E2}$) of the receiving coils (E1 E2), only in case of damping of the proximity switch by a target, the differential voltage is changed and thus a switching signal is effectuated.

16. The proximity switch according to claim 1 characterized in that, when two receiving coils (E1, E2) and one transmitting coil (S) are used, the radius ($r_S$) of the transmitting coil (S) relates to the radii ($r_{E1}$, $r_{E2}$) of the receiving coils (E1, E2) as follows: 3.75 mm($r_S$): 4.7 mm($r_{E1}$): 6.7 mm($r_{E2}$)±25% tolerance.

17. The proximity switch according to claim 16, characterized in that, if a peripheral printed conductor (LB) is present and at a scaling factor of 1, the radius ($r_{LB}$) of the printed conductor (LB) at the radii ($r_{E1}$, $r_{E2}$) of the receiving coils (E1, E2) is the 3.75 mm($r_S$): 4.7 mm($r_{E1}$): 6.7 mm($r_{E2}$)±25% tolerance, 7.1 mm.

* * * * *